United States Patent [19]

McCollough

[11] 4,180,320

[45] Dec. 25, 1979

[54] PHOTOGRAPHIC APPARATUS FOR USE IN MAKING PRINTING PLATES

[75] Inventor: John D. McCollough, Los Angeles, Calif.

[73] Assignee: Delta Microfilm, Los Angeles, Calif.

[21] Appl. No.: 906,121

[22] Filed: May 15, 1978

Related U.S. Application Data

[63] Continuation-in-part of Ser. No. 798,123, May 18, 1977, Pat. No. 4,105,325.

[51] Int. Cl.$^2$ .................................................. G03B 27/44
[52] U.S. Cl. .......................................... 355/54; 355/74
[58] Field of Search ............................... 355/53, 54, 74

[56] References Cited

U.S. PATENT DOCUMENTS 3,907,426  9/1975  Goodliffe ........................... 355/54 X
3,998,546  12/1976  Wally, Jr. et al. .................. 355/54 X Primary Examiner—Richard A. Wintercorn

[57] ABSTRACT

An apparatus for use in making printing plates in which a sheet of photo-sensitive material is held by a hanger and moved horizontally and vertically. Successive areas are, in this manner, aligned with a projector and exposed to separate images, each image corresponding to one page of a book. Telescoping cylinders produce the desired movement of the sheet in discrete steps so the position of the sheet need not be manually adjusted for each image. Fine adjustment of the position of the image on the sheet is obtained by moving two positioning rollers while the image is projected onto a movable registration screen that blocks the projection of the image onto the sheet until after the adjustment has been made.

19 Claims, 9 Drawing Figures

U.S. Patent Dec. 25, 1979 Sheet 1 of 3 4,180,320
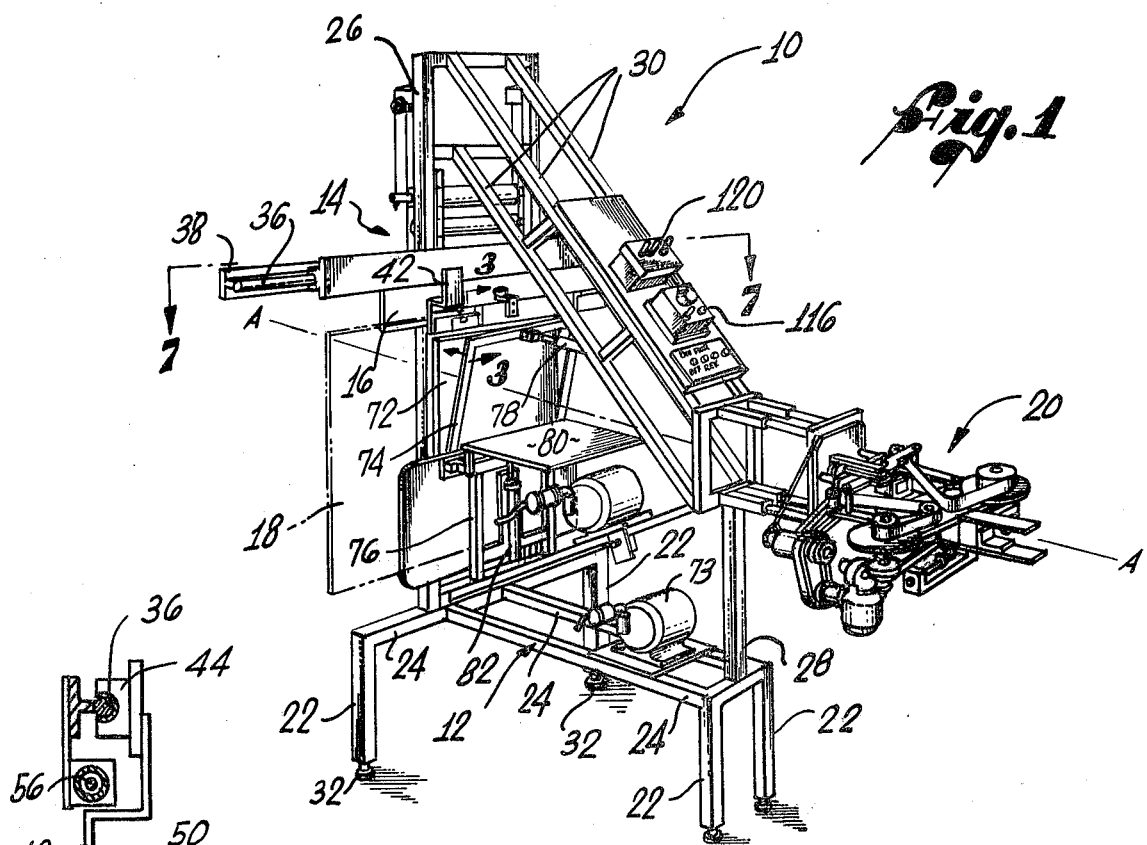
Fig. 1
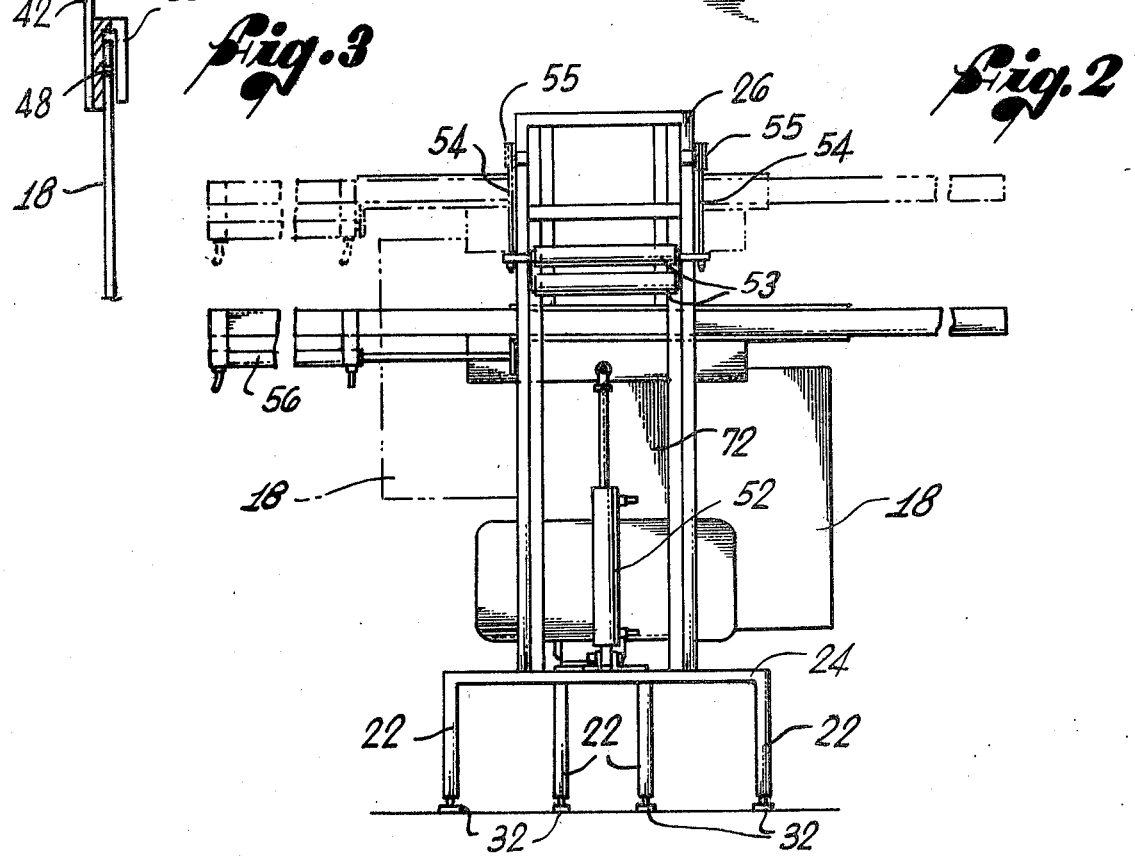
Fig. 3
Fig. 2

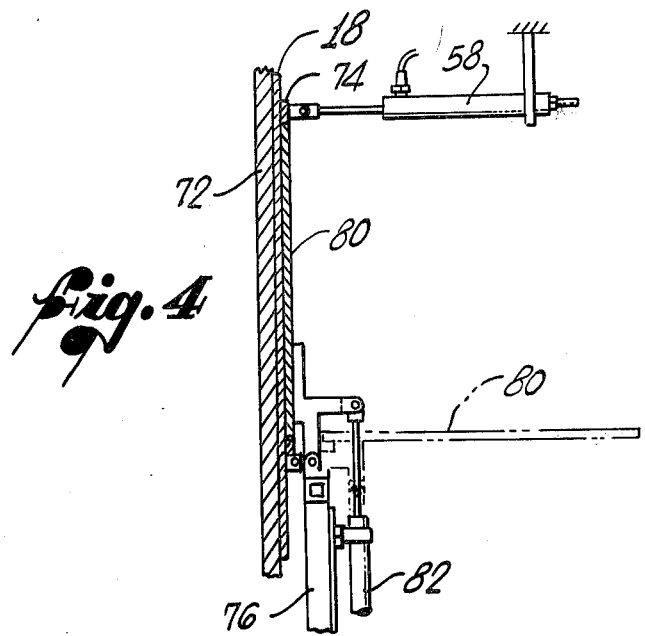
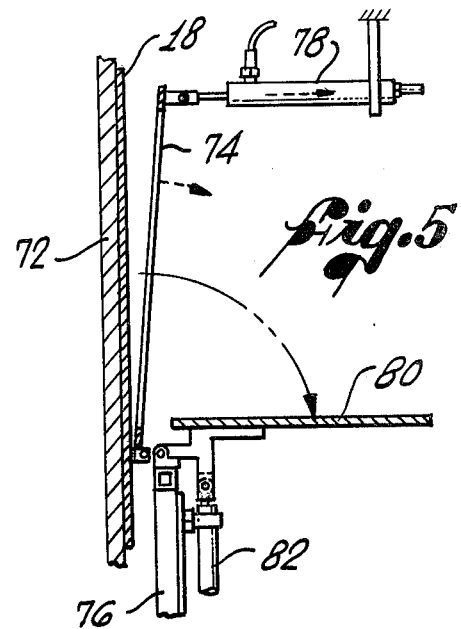
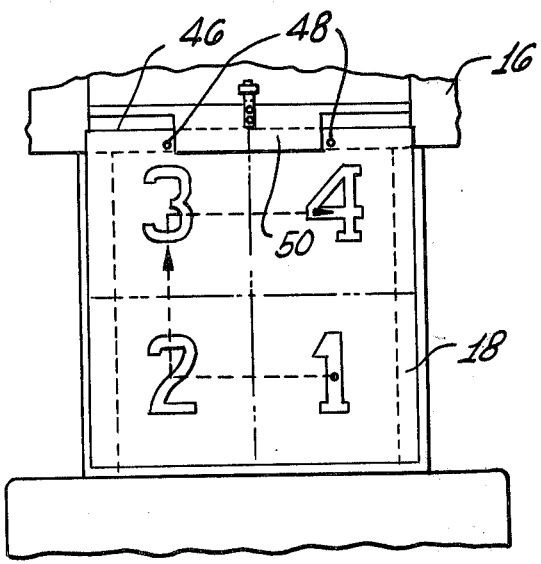
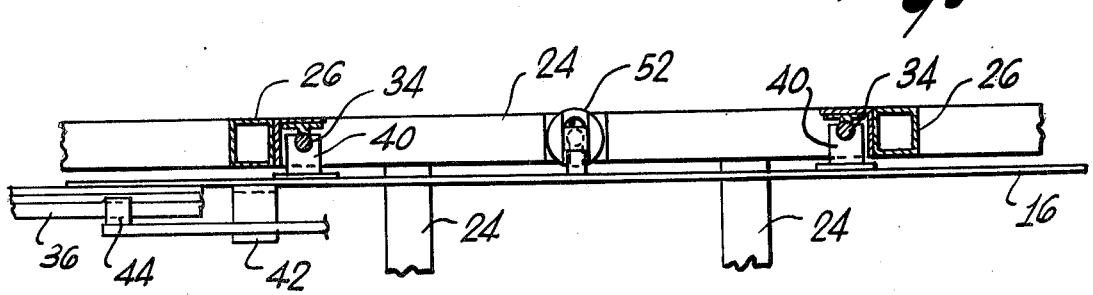

PHOTOGRAPHIC APPARATUS FOR USE IN MAKING PRINTING PLATES

RELATED APPLICATIONS

This is a continuation-in-part of an application Ser. No. 798,123, entitled MICROPLATE SYSTEM filed on May 18, 1977 now U.S. Pat. No. 4,105,325 issued Aug. 8, 1978.

BACKGROUND OF THE INVENTION

The present invention relates to the manufacture of books, and more particularly to an apparatus for the production of printing plates by a photographic process.

According to the conventional method for the manufacture of books the content of which is available in the form of photographic transparencies, groups of negatives, each representing one page, are stripped together into large composite negatives known as flats. A single flat assembly includes four or more pages arranged in two parallel rows, one row being inverted with respect to the other. The flats are used to make plates, each of which is capable of printing a single sheet known as a signature. After folding so that the pages of a signature are in sequential order and properly oriented, the pages are bound by gluing or sewing.

Recent advances in printing technology permit the manufacture of photo-direct plates which can be directly exposed to a projected image, bypassing the previously required negative to plate contact print, and the step of stripping together the separate negatives, which is a time-consuming and costly part of the process.

SUMMARY OF THE INVENTION

The present invention provides an apparatus for making printing plates that eliminates the need for stripping together page negatives into flats, thereby substantially reducing labor and material costs. The apparatus includes a support on which a track mechanism is mounted, and a hanger for a vertical sheet of photo-sensitive material that is movable both horizontally and vertically on the track. Pre-recorded micrographic images corresponding to individual pages are enlarged and projected into successive exposure areas of the photo-sensitive sheet. The exposure areas may be defined by a movable frame that, in cooperation with a vacuum, holds the sheet flat against a backing plate during the exposures.

Separate areas of the sheet are exposed sequentially by moving a hanger on the tracks, each movement encompassing a discrete predetermined distance. In one apparatus constructed in accordance with the invention, the hanger and horizontal track move vertically on a pair of vertical tracks, and the hanger is movable along the horizontal track. A transport mechanism that moves the hanger includes fluid-actuated telescoping cylinders that produce horizontal and vertical movement.

The invention can be advantageously employed to produce plates in which four pages are included in the signature format, only two telescoping cylinders then being required.

According to another aspect of the invention, precision adjustment of the position of the pre-recorded image with respect to the sheet is accomplished by an apparatus that includes a provision for moving the pre-recorded image perpendicularly with respect to the axis of a projector that projects the image onto the sheet. A registration screen can be provided which is movable into a blocking position to prevent exposure of the sheet until proper registration has been obtained by adjusting the image position.

Pre-recorded images are often in the form of a film strip. A particular frame can be precisely aligned with an exposure area of the sheet by positioning two guide rollers located on opposite sides of the projector axis. The rollers can be shifted from side to side in unison until the proper registration is obtained. This guide roller arrangement is particularly advantageous when, unlike conventional motion picture film, there is no precisely predetermined relationship between the frames and the sprocket holes by which the film is advanced.

Other features and advantages of the present invention will become apparent from the following detailed description taken in conjunction with the accompanying drawings which illustrate, by way of example, the principles of the invention.

BRIEF DESCRIPTION OF THE DRAWINGS

FIG. 1 is a perspective view of an exemplary apparatus for making printing plates embodying many novel features of the present invention;

FIG. 2 is a plane view of the back of the apparatus showing the photo-sensitive sheet in one position in solid lines and in another position in phantom lines;

FIG. 3 is an enlarged, fragmentary, cross-sectional view of the apparatus, taken along the line 3—3 of FIG. 1, and showing the horizontal track of FIG. 1;

FIG. 4 is an enlarged, fragmentary, cross-sectional view of a portion of the apparatus with the registration screen in its image blocking position;

FIG. 5 is an enlarged, fragmentary, cross-sectional view, similar to FIG. 4, with the registration screen in the position it assumes while an exposure is in progress;

FIG. 6 is an enlarged, fragmentary view of the apparatus showing the photo-sensitive sheet with its four exposure areas;

FIG. 7 is an enlarged, fragmentary, cross-sectional view taken along the center portion of the line 7—7 of FIG. 1 and showing the vertical track of the apparatus;

DESCRIPTION OF THE PREFERRED EMBODIMENT

Figure 8:
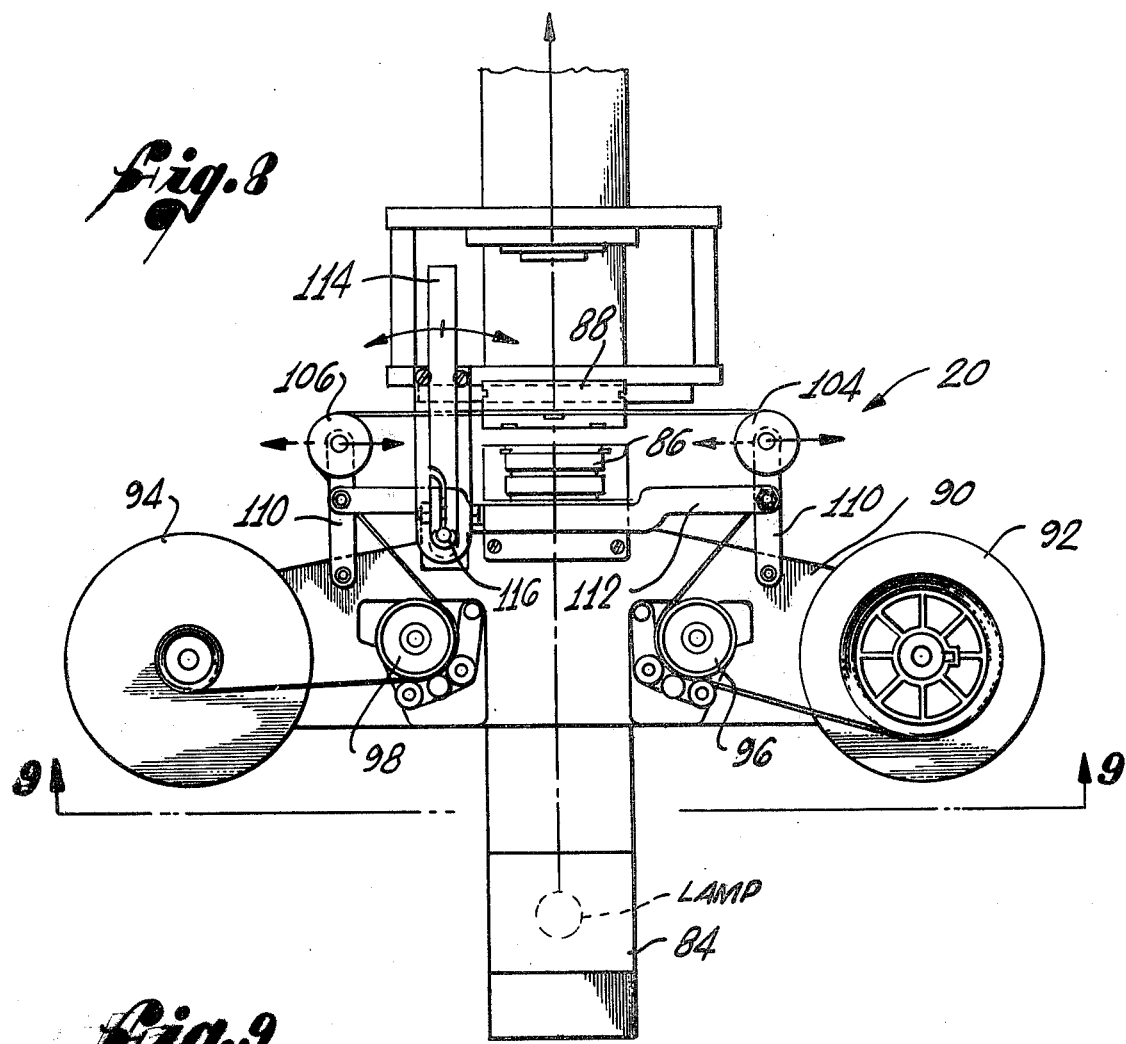
FIG. 8 is an enlarged, fragmentary, top view of the apparatus showing the projector.
Figure 9:
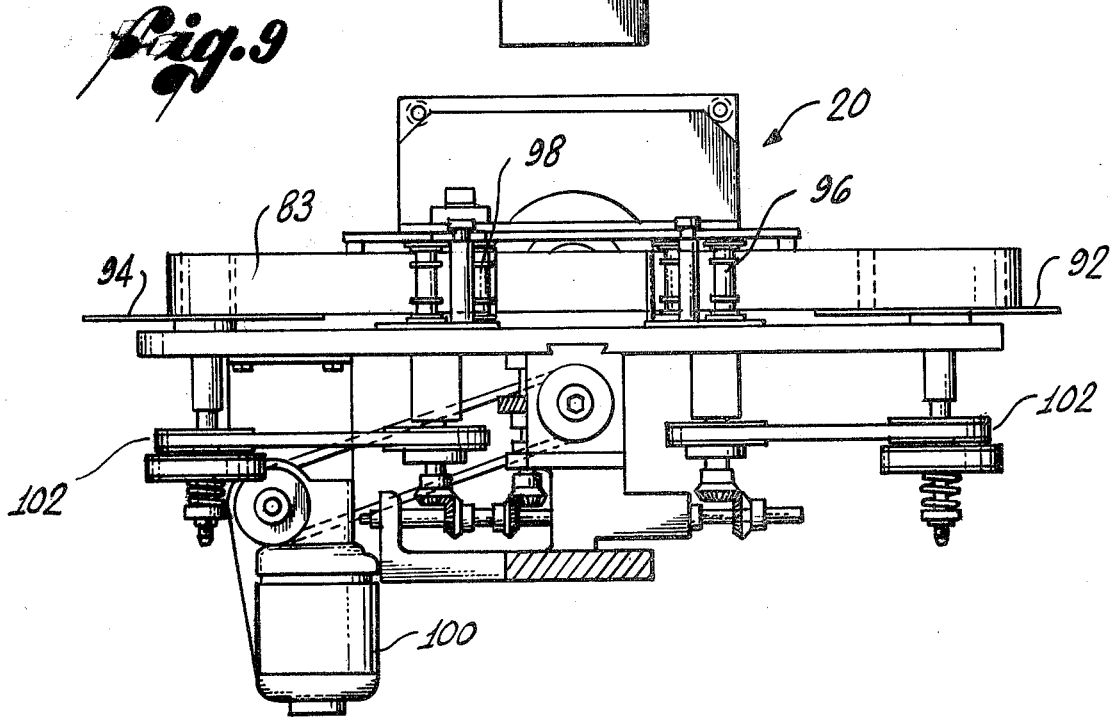
FIG. 9 is an enlarged, fragmentary, cross-sectional view of the projector taken along the line 9—9 of FIG. 4.

An exemplary apparatus 10 embodying many novel features of the present invention and useful for making printing plates is depicted in FIGS. 1 through 9. It includes an open steel framework that forms a support 12, a track mechanism 14 attached to the support, a hanger 16 for a photo-sensitive sheet 18 (shown in phantom lines in FIG. 1) movable on the track mechanism, and a projector 20 mounted on the support and aligned with the sheet.

As best shown in FIG. 1, the support 12 includes four short vertical legs 22, a plurality of horizontal members 24 connecting the legs, a vertical mast 26 at one end, and a shorter vertical post 28 at the opposite end. Four parallel braces 30 are inclined upwardly from the top of the post 28 to the top of the mast 26. The legs 22 are provided with individually adjustable feet 32 to eliminate any rocking movement.

The track mechanism 14 includes a pair of vertical tracks 34 (FIG. 7) that extend along the mast 26 and a horizontal track 36 (FIGS. 1 and 3) that rides up and down on the vertical tracks, each of the tracks taking the form of a cylindrical rod. The horizontal track 36, with its supporting structure 38, engages the vertical tracks 34 by ball bushings 40. Horizontal movement of the hanger 16 and sheet 18 is produced by sliding them along the horizontal track 36 from which the hanger is hung by brackets 42 and ball bushings 44. Vertical movement of the hanger 16 and the sheet 18 is accomplished by raising or lowering the horizontal track 36 on the vertical tracks 34.

The photo-sensitive sheet 18 is suspended vertically from the hanger 16, hung along its top edge 46 where it is positioned by two pins 48 received in pre-punched, accurately positioned holes. A spring clip 50 prevents the sheet 18 from disengaging the pins 48, as best shown in FIGS. 3 and 6. Preferably, the sheet 18 is a photodirect material which itself forms the printing plate after exposure. This photo-direct process eliminates the need for exposing the plate to a film negative as a separate processing step, and a variety of photo-direct materials are well known and commercially available.

A pneumatic transport mechanism propels the hanger 16 and sheet 18 both vertically and horizontally along the track mechanism 14. The component of the transport mechanism that produces vertical motion is a vertically oriented, telescoping, air cylinder 52 (shown in FIGS. 2 and 7). Controlled by electromagnetically actuated valves (not shown), the vertical cylinder 52 can assume either of two positions, fully extended or fully retracted. With the vertical cylinder 52 extended, a bottom row of two exposure areas 1 and 2 on the sheet 18 can be aligned with the projector 20 (as shown in phantom lines on the left in FIG. 2). When the vertical cylinder 52 is retracted, the sheet 18 moves downwardly a predetermined distance for exposure of a parallel top row of two exposure areas 3 and 4 (as shown in solid lines on the right in FIG. 2 and in phantom lines in FIG. 1).

So that the vertical cylinder 52 need not act against the entire weight of the sheet 18, hanger 16, horizontal track 36, and supporting structure 38 when raising or holding the sheet to expose the bottom row of images, a pair of counterweights 53 are provided on the back side of the mast 26. Cables 54 that extend over pulleys 55 on the sides of the masts 26 connect the counterweights 53 to the horizontal track supporting structure 38.

Horizontal movement of the hanger 16 and the photo-sensitive sheet 18 is produced by a similar telescoping, air-actuated cylinder 56 (FIGS. 2 and 3). With the horizontal cylinder 56 fully extended, the hanger 16 and sheet 18 are located at the extreme left-hand side, as shown in FIG. 1, to align the projector 20 with either of the exposures areas No. 1 or 4 on the right-hand side of the sheet 18 (see FIG. 6 with respect to the positions of the four exposure areas on the sheet). When the horizontal cylinder 56 is retracted, the sheet 18 and hanger 16 move one discrete horizontal step of predetermined length to the right along the horizontal track 36 to align one of the areas 2 or 3. The operator of the apparatus 10 thus can bring the exposure areas 1 through 4 into proper alignment in the desired sequence. If only two exposure areas per sheet are desired, the horizontal cylinder 56 can be used alone, or the vertical cylinder 52 can be used alone.

Since the stroke of the cylinders 52 and 56 automatically produces the proper length of movement, the operator need not take time to adjust the position of the sheet 18 for each exposure and the steps of exposing the successive areas 1 through 4 can take place in rapid succession. The entire sheet 18 can be exposed quickly and efficiently in sharp contrast to the time-consuming and painstaking process of stripping page negatives and contact printing.

The individual exposure area of the sheet 18 positioned in the focal plane of the projector 20 hangs in front of a vertical backing plate 72 which is attached to the mast 26 and perpendicular to the lens axis A—A of the projector 20, as best shown in FIG. 1. The sheet 18 can be held flat against the plate 72 by a rectangular frame 74 pivotably mounted along its bottom edge on a bracket 76 that extends upwardly from one of the horizontal mounting members 24. At its top edge, the frame 74 is connected to an air cylinder 78 that is, in turn, supported by the braces 30.

When the air cylinder 78 is fully extended, the frame 74 is vertical and holds the sheet 18 firmly against the backing plate 72, as best shown in FIG. 4. A vacuum, provided by a pump 73, acts through perforations (not shown) in the backing plate 72 to assist in holding the sheet 18 flat. To allow the sheet 18 to move in the absence of a vacuum, the cylinder 78 is contracted pivoting the frame 74 and moving it outwardly away from the sheet, as shown in FIGS. 1 and 5.

A plate 80 that forms a registration screen is pivotably mounted on the same bracket 76 that holds the frame 74, but the registration plate is movable from a vertical position (FIG. 4) in which it overlies and blocks the exposure area 1, 2, 3 or 4 of the sheet 18 that is positioned before the projector 20, and a horizontal position (FIGS. 1 and 5, in phantom lines in FIG. 4) in which is does not interfere with the projection of an image onto the sheet 18. Movement of the registration plate 80 is produced by an air cylinder 82 which extends in a generally vertical position along the bottom portion of the mast 26 and is attached to the registration plate near its bottom end.

When an image is to be recorded on an area of the sheet 18, the plate 80 is first moved into its blocking position to serve as a screen on which the image is displayed. The position of the image can then be observed and compared to registration marks on the plate 80 (not shown) without exposing the sheet 18. Once the image has been satisfactorily aligned, the plate 80 is moved into its horizontal position and the sheet 18 is exposed.

Whether or not the use of the registration screen 80 is called for depends upon the accuracy required in positioning the images on the sheet 18 and the form in which the pre-recorded images are availabe. Pre-recorded images to be used in connection with apparatus 10 of the present type are often available in the form of a perforated film strip 83 on which successive frames are arranged in a single row in the general configuration of a conventional motion picture film. Unlike conventional motion picture film, however, there is no precise predetermined relationship between the perforations and the individual frames. Preselected frames may be inverted when the strip 83 is prepared so that a desired signature format will result.

The exemplary projector 20 (shown in FIGS. 1, 8 and 9) is suitable for use with such a film strip 83. It includes a lamp 84, a condensing lens 86, and an image forming lens 88 cantilevered from the top of the vertical post 28 and thus supported in a fixed position. Also mounted from the post 28 in a fixed horizontal position and directly supporting the image forming lens 88 is a support plate 90 which carries a supply spool 92 on one side of the projector axis A—A and a take-up spool 94 on the opposite side of the axis. Located between the spools 92 and 94 on the plate 90 are two film advance sprockets 96 and 98 with teeth that engage the perforations in the film 82. The spools 92 and 94 and sprockets 96 and 98 are driven in the conventional manner by an electric motor 100, the sprockets being driven at a constant speed while the spools are driven at variable speeds through friction clutches 102 so that their speed is adjusted, by variation in the slippage of the clutches, to compensate for the varying spool diameters.

The projector 20 also includes two film positioning guide rollers 104 and 106, one roller being disposed on each side of the lenses 86 and 88 and the axis A—A. The film 83 is threaded from the supply spool 92 around the first sprocket 96 back around the first guide roller 104 through a film gate 108 between the lenses 86 and 88, around the second guide roller 106, and then around the second sprocket 98 to the take-up spool 94 (FIG. 8). A pair of arms 110 are pivotably attached to the plate 90 and extend toward the sheet 18, each of the rollers 104 and 106 being rotatably mounted on the outer end of one of the arms. An elongated link 112 extends perpendicular to the projector axis A—A and connects the two arms 110 maintaining them in a parallel orientation. Thus, the arms 110 and their respective rollers 104 and 106 can move from side to side in unison to adjust the positions of the frame before the lenses 86 and 88 until proper registration is determined with reference to the registration on the screen 80 and the sheet 18.

Desired film movement is readily produced by a lever 114 which has a fixed pivot point 115. When the lever 114 is turned manually, a cam 116 is rotated, the cam engaging a socket integrally formed with the link 112 to produce lateral movement of the link and the rollers 104 and 106.

It will be noted that the guide rollers 104 and 106 uniquely cooperate with the registration plate 80 to allow fine adjustment of the exposure position of an individual frame even though there may be superficial variations in the placement of frames on the film 83. Adjustment in this manner is far easier, faster and more accurate than attempting to position the film by activating the motor 100. When the ability to quickly and easily position the film 83 is further combined with automatic precision movement of the film that results from the use of the cylinders 52 and 56 and the track mechanism 14, it is possible for a relatively unskilled operator to achieve a high rate of quality production.

The duration of illumination for a single exposure is controlled by a timer 116 mounted on a control panel 118 that is supported in a readily accessible position by the braces 30, as shown in FIG. 1. The frame 74 is moved by the air cylinder 78 and the vacuum is applied to the backing plate 72 in response to the operation of electro-magnetic valves (not shown) by the timer 116. Toggle switches 120 that control the cylinders 52 and 56 are also mounted on the panel 118.

While particular forms of the invention have been illustrated and described, it will be apparent that various modifications can be made without departing from the spirit and scope of the invention.

I claim:

1. An apparatus for use in making printing plates including a plurality of pages arranged in a predetermined format comprising:

a support;

hanger means for holding a sheet of photosensitive material;

track means for attaching said hanger means to said support while permitting horizontal and vertical movement thereof;

first transport means comprising a fluid-actuated cylinder for moving said hanger means along said track means a predetermined distance in a first direction upon actuation thereof;

second transport means comprising a fluid-actuated cylinder for moving said hanger means along said track means a predetermined distance in a second direction perpendicular to said first direction upon actuation thereof, whereby said hanger means and said sheet are capable of assuming at least four predetermined exposure positions in response to actuation of said first and second transport means;

control switch means for actuating said first and second transport means;

projection means for projecting a pre-recorded image from a transparency onto an exposure area of said sheet; and positioning means for adjustably positioning said transparency with respect to said projection means to obtain proper registration of said image on said sheet.

2. The apparatus of claim 1 further comprising:

a registration screen for receiving an image projected by said projection means; and means for moving said registration screen between a first position in which it does not interfere with the projection of said image onto said sheet by said projection means, and a second position in which it is disposed so as to receive an image projected by said projection means.

3. An apparatus for use in making printing plates including a plurality of pages arranged in a predetermined format comprising:

a support;

hanger means for holding a flat sheet of photo-sensitive material;

track means for attaching said hanger means to said support while permitting horizontal and vertical movement thereof;

first transport means for moving said hanger means along said track means a predetermined distance in a first direction upon actuation thereof;

second transport means for moving said hanger means along said track means a predetermined distance in a second direction perpendicular to said first direction upon actuation thereof, whereby said hanger means and said sheet are capable of assuming at least four predetermined exposure positions in response to actuation of said first and second transport means;

control switch means for actuating said first and second transport means;

projection means for enlarging and projecting a pre-recorded image from a transparency onto an exposure area of said sheet; and positioning means for adjustably positioning said transparency with respect to said projection means to obtain proper registration of said image on said sheet, said positioning means comprising a pair of guides disposed on opposite sides of the projection axis of said projection means and linkage means for maintaining said guides at a fixed distance from each other.

4. The apparatus of claim 3 wherein said positioning means further comprises a stationary structure and two parallel members each pivotably attached to said stationary structure said linkage means being pivotably attached to said parallel members.

5. The apparatus of claim 1 further comprising:

a registration plate for receiving an image projected by said projection means; and means for moving said registration plate between a first position in which it does not interfere with the projection of said image onto said sheet by said projection means, and a second position in which it is disposed so as to receive an image projected by said projection means.

6. The apparatus of claim 5 wherein said projection means further comprises a light source and an image forming lens.

7. An apparatus for use in making printing plates including a plurality of pages arranged in a predetermined format comprising:

a support;

hanger means for holding a flat sheet of photo-sensitive material;

track means for attaching said hanger means to said support while permitting horizontal and vertical movement thereof;

first transport means for moving said hanger means along said track means a predetermined distance in a first direction upon actuation thereof;

second transport means, for moving said hanger means along said track means a predetermined distance in a second direction perpendicular to said first direction upon actuation thereof, whereby said hanger means and said sheet are capable of assuming at least four predetermined exposure positions in response to actuation of said first and second transport means;

control switch means for actuating said first and second transport means;

projection means for enlarging and projecting a prerecorded image from a transparency onto an exposure area of said sheet;

a registration plate for receiving an image projected by said projection means; and means for moving said registration plate between a first position in which it does not interfere with the projection of said image onto said sheet by said projection means, and a second position in which it is disposed so as to receive an image projected by said projection means, said means for moving said registration plate comprising a fluid-actuated cylinder.

8. An apparatus for use in making printing plates consisting of four pages of a book arranged in a predetermined signature format comprising:

a support;

hanger means for holding a flat sheet of photo-sensitive material;

track means for attaching said hanger means to said support while permitting horizontal and vertical movement thereof;

first transport means comprising a fluid-actuated cylinder for moving said hanger means along said track means a predetermined distance in a first direction upon actuation thereof;

second transport means comprising a fluid-actuated cylinder for moving said hanger means along said track means in a second direction perpendicular to said first direction upon actuation thereof, whereby said hanger means and said sheet are capable of assuming four predetermined exposure positions in response to actuation of said first and second transport means;

control switch means for actuating said first and second transport means; and projection means for enlarging and projecting a prerecorded image from a transparency onto an exposure area of said sheet.

9. The apparatus of claim 8, wherein said projection means comprises a light source, a condenser lens and an image forming lens.

10. The apparatus of claim 9, wherein said projection means further comprises means for positioning successive frames of a film strip containing said transparency before said image forming lens.

11. The apparatus of claim 8 further comprising a plurality of pulleys rotatably mounted on said support, a plurality of cables attached to said hanger means and extending over said pulleys, and a counterweight attached to said cables.

12. The apparatus of claim 8, wherein said track means comprises a single horizontal track and a vertical track, said horizontal track being movable on said vertical track.

13. The apparatus of claim 12, wherein said hanger means is attached to said horizontal track for vertical movement therewith.

14. The apparatus of claim 8 further comprising:

a backing plate; and a frame adjacent said backing plate for holding an exposure area of said sheet flat against said backing plate in alignment with the axis and in the focal plane of said projection means.

15. The apparatus of claim 8 wherein said projection means further comprises a light source, an image forming lens and means for adjustably positioning an image bearing transparency before said lens to obtain proper registration of said image on said sheet.

16. The apparatus of claim 15 further comprising:

a registration plate for receiving an image projected by said projection means; and means for moving said registration plate between a first position in which it does not interfere with the projection of said image onto said sheet by said projection means, and a second position in which it is disposed so as to receive an image projected by said projection means.

17. An apparatus for use in making printing plates in signature format comprising:

an open framework forming a support;

a pair of stationary vertical tracks attached to said support;

a horizontal track vertically movable along said vertical tracks;

hanger means for holding a sheet of photo-direct material in a vertical plane for exposure, said hanger being supported from said horizontal track and movable therealong;

vertical transport means comprising an air cylinder for moving said horizontal track and said hanger means along said vertical tracks;

a counterweight;

a plurality of cables connecting said counterweight to said horizontal track;

horizontal transport means track for moving said hanger means a predetermined distance along said horizontal track, said second transport means comprising an air cylinder;

control switch means for actuating said air cylinders of said first and second transport means;

a backing plate extending along a portion of said exposure plane;

a frame adjacent said backing plate for holding a section of said photo-direct sheet flat against said backing plate;

projection means for enlarging and projecting a prerecorded micrographic image from a selected frame of a film strip onto an area of said photo-direct sheet, said projection means comprising a light source, a pair of plano-convex lens elements forming a condensing lens, and an image forming lens;

a film supply spool;

a film take-up spool;

a pair of film positioning rollers around which a film passes as it is advanced from said supply spool and said take-up spool;

means for advancing said film;

means for moving said guide rollers to adjust the position of a projected image on said sheet;

a registration plate for receiving an image projected by said projection means; and means for moving said registration plate between a first position in which it does not interfere with the projection of said image onto said sheet by said projection means, and a second position in which it is disposed so as to receive an image projected by said projection means.

18. An apparatus for use in making printing plates including a plurality of pages arranged in a predetermined format comprising:

a support;

hanger means for holding a sheet of photosensitive material;

track means for attaching said hanger means to said support while permitting horizontal and vertical movement thereof;

first transport means for moving said hanger means along said track means a predetermined distance in a first direction upon actuation thereof;

second transport means for moving said hanger means along said track means a predetermined distance in a second direction perpendicular to said first direction upon actuation thereof, whereby said hanger means and said sheet are capable of assuming at least four predetermined exposure positions in response to actuation of said first and second transport means;

control switch means for actuating said first and second transport means;

projection means for enlarging and projecting a prerecorded image from a transparency onto an exposure area of said sheet;

positioning means for adjustably positioning said transparency with respect to said projection means to obtain proper registration of said image on said sheet;

a registration screen for receiving an image projected by said projection means; and air cylinder means for moving said registration screen between a first position in which it does not interfere with the projection of said image onto said sheet by said projection means, and a second position in which it is disposed so as to receive an image from said projection means.

19. An apparatus for use in making printing plates including a plurality of pages arranged in a predetermined format comprising:

a support;

hanger means for holding a sheet of photosensitive material;

track means for attaching said hanger means to said support while permitting horizontal and vertical movement thereof;

first transport means for moving said hanger means along said track means a predetermined distance in a first direction upon actuation thereof;

second transport means for moving said hanger means along said track means a predetermined distance in a second direction perpendicular to said first direction upon actuation thereof, whereby said hanger means and said sheet are capable of assuming at least four predetermined exposure positions in response to actuation of said first and second transport means;

control switch means for actuating said first and second transport means;

projection means for enlarging and projecting a prerecorded image from a transparency onto an exposure area of said sheet;

positioning means for adjustably positioning said transparency with respect to said projection means to obtain proper registration of said image on said sheet;

a registration plate for receiving an image projected by said projection means; and means for moving said registration plate between a first position in which it does not interfere with the projection of said image onto said sheet by said projection means and a second position in which it is disposed so as to receive an image projected by said projection means.

* * * * *